United States Patent
Holloway

[11] Patent Number: 6,037,230
[45] Date of Patent: Mar. 14, 2000

[54] METHOD TO REDUCE DIODE CAPACITANCE OF SHORT-CHANNEL MOSFETS

[75] Inventor: Thomas C. Holloway, Murphy, Tex.

[73] Assignee: Texas Instruments Incorporated, Dallas, Tex.

[21] Appl. No.: 09/089,320

[22] Filed: Jun. 1, 1998

Related U.S. Application Data

[60] Provisional application No. 60/048,537, Jun. 3, 1997.

[51] Int. Cl.[7] .................................................. H01L 21/336
[52] U.S. Cl. ..................... 438/289; 438/290; 438/299; 438/301; 438/305; 438/307
[58] Field of Search .................... 438/289, 290, 438/299, 301, 303, 305, 306, 307

[56] References Cited

U.S. PATENT DOCUMENTS

| | | | |
|---|---|---|---|
| 5,328,862 | 7/1994 | Goo | 438/289 |
| 5,416,033 | 5/1995 | Lee et al. | 438/301 |
| 5,504,023 | 4/1996 | Hong | 438/305 |
| 5,736,446 | 4/1998 | Wu | 438/305 |
| 5,793,088 | 8/1998 | Choi et al. | 257/408 |

*Primary Examiner*—Carl Whitehead, Jr.
*Assistant Examiner*—Khanh Duong
*Attorney, Agent, or Firm*—Wade James Brady III; Richard L. Donaldson

[57] ABSTRACT

A method of fabricating a semiconductor device and the device. There is provided a substrate (21) of semiconductor material. A gate electrode (25) is formed over the substrate (21) having a sidewall (27) and electrically isolated from the substrate. Source/drain regions (29, 31) are formed in the substrate defining a channel in the substrate extending beneath the gate electrode. One of a pocket region or a halo region (33) extending substantially entirely under the gate electrode and sidewall is then formed. The pocket region or halo region is formed by providing a compensating species which is implanted at the time of the source/drain implant in order to compensate the doping increase under the source/drain caused by the pocket or halo implant. Since the implant dose and range of this compensating implant is comparable to the pocket or halo implant, no penetration of the gate electrode should occur. Also, since the compensating implant is performed after the sidewall spacer is formed, the pocket or halo is not compensated in the region wherein it is required for reduction of MOS transistor short channel effects.

4 Claims, 1 Drawing Sheet

METHOD TO REDUCE DIODE CAPACITANCE OF SHORT-CHANNEL MOSFETS

This application claims priority under 35 USC 119(e)(1) of provisional application No. 60/048,537 filed Jun. 3, 1997.

BACKGROUND OF THE INVENTION

1. Field of the Invention

This invention relates to a method of fabricating a MOSFET and the MOSFET.

2. Brief Description of the Prior Art

As the geometries of semiconductor devices and particularly MOS transistors are being scaled to continually shorter gate lengths, there is a requirement for reduction in short channel effects. It is known that these short channel effects can be reduced by the use of non-uniform doping levels in the channel region. One manner of obtaining such non-uniform doping levels in the channel region has been by the use of pocket or halo implants. Both a pocket and a halo implant involve, in addition to the standard source/drain implant, the introduction of an implant which is both normal as well as partially at an angle of from about 10 to about 80 degrees and preferably about 30 to 40 degrees relative to a normal to the substrate surface. The pocket or halo implant is of opposite conductivity type to that of the source/drain region, is directed partially under the gate electrode and uses the gate electrode as a mask. In this manner, a pocket or halo region is formed which abuts the source/drain region, is immediately adjacent to the channel region and extends under the gate electrode to provide a region between the source/drain and the channel which is more highly doped than the channel region and of like conductivity type.

Unfortunately, the pocket and halo depth and doping levels are such that the doping level is increased under the source/drain diode area, causing an increase in diode capacitance between source/drain and pocket or halo thereat. This increased capacitance degrades the electrical characteristics of the semiconductor device. Current pocket and halo implants are either not used at all or are used in moderation to minimize the problems inherent in the presence of the increased diode capacitance under the source/drain regions.

A typical process flow as used in the prior art to fabricate an MOS transistor having a pocket or halo implant is shown with reference to FIGS. 1a and 1b wherein, as shown in FIG. 1a, there is provided a substrate 1 of semiconductor material, such as, for example, silicon, onto which has been formed, in standard manner, such as by thermal growth or chemical vapor deposition (CVD), a layer of silicon dioxide 3. A polysilicon gate 5 is formed over the silicon dioxide layer 3 in standard manner, such as by deposition of polysilicon over the silicon dioxide layer 3 with subsequent patterning and etching to form the gate structure. At this time, an optional screen oxide can be formed, either thermally or deposited. A lightly doped drain (LDD) to moderately doped drain (MDD) is formed, generally by a simple ion implantation of phosphorus and/or arsenic for n-channel and boron or $BF_2$ molecular ions for p-channel with doses in the range from about $1 \times 10^{13}$ to about $1 \times 10^{15}$ $cm^{-2}$ for LDD to MDD and with incidence usually near normal to the surface plane. The pocket or halo is then implanted, this being an ion implantation of the same conductivity type as the substrate and opposite conductivity type to the LDD/MDD with lesser doses in the range from about $1 \times 10^{12}$ to about $1 \times 10^{14}$ $cm^{-2}$ with incidence angles usually equal to or greater than the LDD/MDD implantation and possibly rotated about an axis perpendicular to the surface using the gate 5 as a mask. An optional anneal can take place at this point to limit transient enhanced diffusion (TED). A sidewall spacer 7 is formed in standard manner, generally of silicon dioxide, silicon nitride or a combination of silicon dioxide and silicon nitride, and the source/drain implants at doses of generally from about $1 \times 10^{15}$ $cm^{-2}$ which are of opposite conductivity type to the pocket or halo implant, are provided followed by an anneal to activate the dopant. With the subsequent annealing, source/drain regions 9, 11 are formed with the pocket implant 13 extending under the source/drain regions as well as under the gate 5 to isolate the source/drain regions from the channel 15 as shown in FIG. 1b.

It can be seen with reference to FIG. 1b that the use of the pocket 13 causes an increased doping under the source/drain regions 9, 11 of conductivity type opposite to that of the source/drain regions. This added doping is the source of increased capacitance discussed above which is undesirable and degrades the electrical properties of the device.

SUMMARY OF THE INVENTION

In accordance with the present invention, the above described problems of the prior art are minimized and there is provided an MOS transistor which derives the benefits of the pocket or halo configuration with minimal increased capacitance.

There is provided a compensating implant after sidewall spacer formation of the prior art device described above which can also benefit from use of the same masking as used for the source/drain implant, thereby adding, at most, minimal additional fabrication steps. In this way, the pocket implants can be used with shallow junctions, which are required for tight isolation, without increasing diode capacitance.

Briefly, a compensating species is implanted at the time of the source/drain implant in order to compensate for the doping increase under the source/drain caused by the pocket or halo implant. Since the implant dose and range of this compensating implant is comparable to the pocket or halo implant, no penetration of the gate electrode should occur. Also, since the compensating implant is performed after the sidewall spacer is formed, the pocket or halo is not compensated in the region wherein it is required for reduction of MOS transistor short channel effects. This solution is valid whether the initial pocket or halo implant was implanted at an angle or at normal incidence.

DESCRIPTION OF THE PREFERRED EMBODIMENT

Figure 1A:
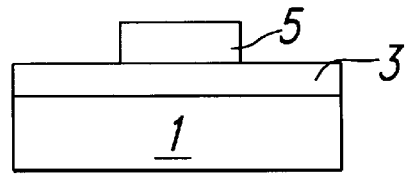
FIGS. 1a and 1b represent a modified process flow for fabrication of an MOS transistor having a pocket in accordance with the prior art.
Figure 1B:
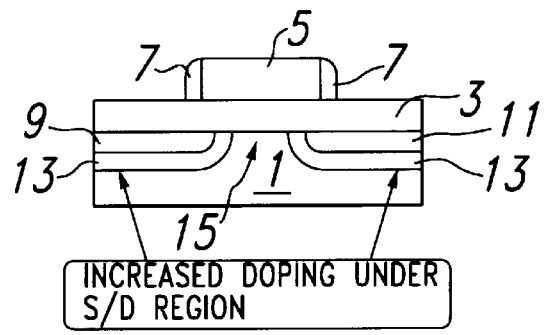
Figure 2A:
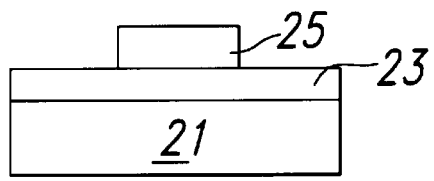
FIGS. 2a and 2d represent a modified process flow for fabrication of an MOS transistor having a pocket in accordance with the present invention.
Figure 2B:
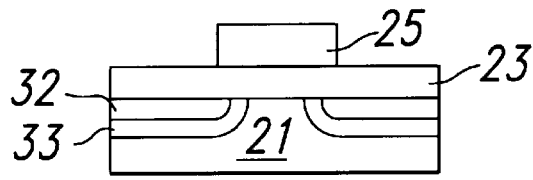
Figure 2C:
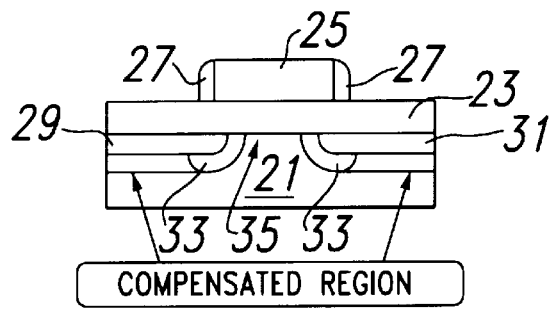
Figure 2D:
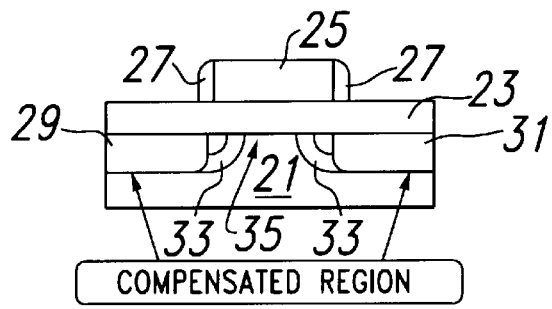

A typical process flow as used in accordance with the present invention to fabricate an MOS transistor having a pocket or halo implant is shown with reference to FIGS. 2a to 2b wherein, as shown in FIG. 2a, there is provided a substrate 21 of P-type silicon, onto which has been formed, in standard manner by chemical vapor deposition (CVD), a layer of silicon dioxide 23. A polysilicon gate 25 is formed over the silicon dioxide layer 23 in standard manner, such as by deposition of polysilicon over the silicon dioxide layer 23 with subsequent patterning and etching to form the gate structure as shown in FIG. 2*a*. A lightly doped drain (LDD) implant 32 and a pocket or halo implant 33 are then provided, the LDD being of opposite conductivity type to that of the substrate 21 and the pocket or halo implant being of the same conductivity type as the substrate, using the gate 25 as a mask as shown in FIG. 2*b*. A sidewall spacer 27 of silicon dioxide is formed in standard manner as shown in FIG. 2*c* and the source/drain 29, 31 implants, which are of opposite conductivity type to the pocket or halo implant 33, are provided as shown in FIG. 2*d*. In addition, using the sidewall spacer 27 as a mask, a pocket or halo compensation implant is provided to neutralize the portion of the pocket or halo implant which is not disposed under the gate 25 and sidewall spacer as shown in FIG. 2*b*. With subsequent annealing, source/drain regions 29, 31 are completed with the pocket implant 33 extending essentially only under the portions of the source/drain regions which lie beneath the gate and the sidewall spacer. During annealing, a portion of the pocket or halo implant 33 may extend laterally to a minor extent beyond the sidewall spacer, this being defined herein as being substantially entirely under the gate electrode and sidewall. In this way, there is isolation of the source/drain regions 29, 31 from the channel 35 without the excessive capacitance presented by the prior art pocket and halo configurations.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of fabricating a semiconductor device which comprises the steps of:

(a) providing a substrate of semiconductor material;

(b) forming a gate electrode over said substrate which is electrically isolated from said substrate;

(c) applying an LDD and one of a pocket or halo implant to said substrate using said gate electrode as a mask, said implant extending under said gate;

(d) forming a sidewall spacer on said gate electrode;

(e) applying a source/drain implant over said one of a pocket or halo implant and neutralize the portion of the pocket or halo implant not extending under said gate and sidewall spacer; and (f) annealing the structure of step (e) to form source/drain regions in said substrate defining a channel in said substrate extending beneath said gate electrode and one of a pocket region or a halo region disposed under said gate electrode and sidewall spacer and between said channel and said source/drain regions.

2. The method of claim 1 wherein said compensating implant is of opposite conductivity type to said one of a pocket or halo implant.

3. The method of claim 1 wherein said substrate is of the same conductivity type as said pocket or halo implant and said source/drain implant is of opposite conductivity type.

4. The method of claim 2 wherein said substrate is of the same conductivity type as said pocket or halo implant and said source/drain implant is of opposite conductivity type.

* * * * *